(12) United States Patent
Nagase et al.

(10) Patent No.: US 9,862,045 B2
(45) Date of Patent: *Jan. 9, 2018

(54) POWER-MODULE SUBSTRATE AND MANUFACTURING METHOD THEREOF

(71) Applicant: MITSUBISHI MATERIALS CORPORATION, Tokyo (JP)

(72) Inventors: Toshiyuki Nagase, Kitamoto (JP); Takeshi Kitahara, Sunto-gun (JP); Ryo Muranaka, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/388,953

(22) PCT Filed: Mar. 27, 2013

(86) PCT No.: PCT/JP2013/059001
§ 371 (c)(1),
(2) Date: Sep. 29, 2014

(87) PCT Pub. No.: WO2013/146881
PCT Pub. Date: Oct. 3, 2013

(65) Prior Publication Data
US 2015/0328706 A1    Nov. 19, 2015

(30) Foreign Application Priority Data
Mar. 29, 2012    (JP) .................................. 2012-077401

(51) Int. Cl.
*B23K 1/00* (2006.01)
*B23K 1/19* (2006.01)
(Continued)

(52) U.S. Cl.
CPC .............. *B23K 1/0016* (2013.01); *B23K 1/19* (2013.01); *B32B 15/04* (2013.01); *B32B 18/00* (2013.01);
(Continued)

(58) Field of Classification Search
None
See application file for complete search history.

(56) References Cited

U.S. PATENT DOCUMENTS 6,071,592 A * 6/2000 Sakuraba ............... H01L 23/142
257/E23.006
9,237,682 B2 * 1/2016 Nagatomo .......... H01L 23/3735
(Continued)

FOREIGN PATENT DOCUMENTS

EP      0895284 A1    2/1999
JP      2001-048671 A  2/2001
(Continued)

OTHER PUBLICATIONS

Extended European Search Report dated Oct. 9, 2015, issued for the European patent application No. 13768726.5.
(Continued)

*Primary Examiner* — Vera Katz
(74) *Attorney, Agent, or Firm* — Locke Lord LLP (57) ABSTRACT

To provide a power-module substrate and a manufacturing method thereof in which small voids are reduced at a bonded part and separation can be prevented. Bonding a metal plate of aluminum or aluminum alloy to at least one surface of a ceramic substrate by brazing, when a cross section of the metal plate is observed by a scanning electron microscope in a field of 3000 magnifications in a depth extent of 5 μm from a bonded interface between the metal plate and the ceramic substrate in a width area of 200 μm from a side edge of the metal plate, residual-continuous oxide existing continuously (Continued)

by 2 µm or more along the bonded interface has total length of 70% or less with respect to a length of the field.

1 Claim, 4 Drawing Sheets (51) Int. Cl.
  *B32B 15/04* (2006.01)
  *H01L 23/373* (2006.01)
  *C04B 37/02* (2006.01)
  *B32B 18/00* (2006.01)
  *H01L 23/473* (2006.01)
  *H05K 3/38* (2006.01)
  *H05K 1/03* (2006.01)
(52) U.S. Cl.
  CPC ........ *C04B 37/026* (2013.01); *H01L 23/3735* (2013.01); *H05K 3/383* (2013.01); *B32B 2457/00* (2013.01); *C04B 2235/6581* (2013.01); *C04B 2235/723* (2013.01); *C04B 2235/963* (2013.01); *C04B 2237/121* (2013.01); *C04B 2237/126* (2013.01); *C04B 2237/128* (2013.01); *C04B 2237/366* (2013.01); *C04B 2237/402* (2013.01); *C04B 2237/52* (2013.01); *C04B 2237/60* (2013.01); *C04B 2237/704* (2013.01); *C04B 2237/706* (2013.01); *C04B 2237/708* (2013.01); *C04B 2237/86* (2013.01); *H01L 23/3736* (2013.01); *H01L 23/473* (2013.01); *H01L 2224/48091* (2013.01); *H01L 2224/73265* (2013.01); *H05K 1/0306* (2013.01); *H05K 3/382* (2013.01)

(56) References Cited

U.S. PATENT DOCUMENTS

| 2007/0274047 A1* | 11/2007 | Nagase | H01L 23/3735 |
| | | | 361/704 |
| 2011/0074010 A1* | 3/2011 | Kuromitsu | H01L 23/3735 |
| | | | 257/703 |

FOREIGN PATENT DOCUMENTS

| JP | 2001-121287 A | 5/2001 |
| JP | 2002-009212 A | 1/2002 |
| JP | 2005-252087 A | 9/2005 |
| JP | 2007-311527 A | 11/2007 |
| JP | 2008-117833 A | 5/2008 |
| JP | 2009-105166 A | 5/2009 |

OTHER PUBLICATIONS

Interntaional Search Report dated Jun. 25, 2013, issued for PCT/JP2013/059001.

* cited by examiner

POWER-MODULE SUBSTRATE AND MANUFACTURING METHOD THEREOF

BACKGROUND OF THE INVENTION

Field of the Invention

The present invention relates to a power-module substrate configuring a power module controlling a large electric current and a large voltage and a manufacturing method thereof.

Priority is claimed on Japanese Patent Application No. 2012-77401, filed Mar. 29, 2012, the content of which is incorporated herein by reference.

Description of the Related Art

Conventionally, as a semiconductor device controlling a large electric current and a large voltage, a power module having a structure in which electronic components such as a semiconductor chip and the like are mounted on a power-module substrate is known. As a manufacturing method of the power module, for example, methods described in Patent Document 1 and Patent Document 2 are known. In these methods: a metal plate being a circuit layer is stacked on one surface of a ceramic substrate interposing brazing material; a metal plate being a heat-radiation layer is stacked on the other surface of the ceramic substrate interposing the brazing material; and those are pressed in a stacking direction and heated so as to bond the metal plates to the ceramic substrate, so that a power-module substrate is manufactured. Subsequently: a top plate part of a heat sink is stacked on a surface of the heat-radiation layer that is opposite to the surface to which the ceramic substrate is bonded interposing the brazing material; and the heat-radiation layer and the heat sink are pressed in this stacking direction and heated so as to bond to each other, so that a power-module substrate with a heat sink is manufactured.

For a bonding method of the metal plate of the power-module substrate and the heat sink, vacuum brazing, soldering, screw clamping, brazing using flux, and the like are applied.

In Patent Document 3, as a bonding method of a top plate of a heat sink and a metal plate of a power-module substrate, it is described to braze with spreading flux. This brazing is a method of bonding by removing oxide on a brazing face by spreading fluoride-based flux on the brazing face and heating in non-oxidizing atmosphere, in which expensive equipment is not necessary and it is comparatively easy to braze stably.

PRIOR ART DOCUMENT

Patent Document

Patent Document 1: Japanese Unexamined Patent Application, First Publication No. 2007-311527
Patent Document 2: Japanese Unexamined Patent Application, First Publication No. 2002-009212
Patent Document 3: Japanese Unexamined Patent Application, First Publication No. 2009-105166

SUMMARY OF THE INVENTION

Problems to be Solved by the Invention

In such power-module substrates, there is a case in which small voids are generated at a braze-bonded part between the ceramic substrate and the metal plate. If the power-module substrate and the heat sink are bonded together in a state in which the small voids are generated, there is a risk that the ceramic substrate and the metal plate would be separated at a bonded interface. Especially, it is remarkable when the heat sink is bonded by brazing using flux as described in Patent Document 3.

The present invention is achieved in consideration of the above circumstances, and has an object to provide a power-module substrate and a manufacturing method thereof in which small voids are reduced at a bonded part and separation can be prevented.

Means for Solving the Problem

By diligent study of reducing small voids generated at a bonded part between a ceramic substrate and a metal plate, the inventors found out that when oxide is adhered to a surface of the metal plate before bonding to the ceramic substrate, small voids are generated accompanying with the oxide if the oxide remains on the bonded part. Accordingly, it was considered that the small voids could be reduced by reducing the oxide remained on the bonded part. However, it was found that the oxide remained on an end part of the bonded part with a specified size caused the separation, though the separation was not occurred when the oxide was dispersed and barely studded in the bonded part between the ceramic substrate and the metal plate. Furthermore, it was found out that the oxide remained at the end part of the bonded part tended to be generated by being flowed along with the brazing material which was melted when brazing the ceramic substrate and the metal plate so as to be converged to the end part.

Hence, a power-module substrate according to the present invention is made by bonding a metal plate made of aluminum or aluminum alloy to at least one surface of a ceramic substrate by brazing, in which: when a cross section of the metal plate is observed by a scanning electron microscope in a field of 3000 magnifications in a depth extent of 5 µm from a bonded interface between the metal plate and the ceramic substrate in a width area of 200 µm from a side edge of the metal plate, residual-continuous oxides existing continuously by 2 µm or more along the bonded interface has total length of 70% or less with respect to a length of the field.

The residual-continuous oxides are that have a length of 2 µm or more out of residual oxide existing along the bonded interface. If a plurality of the residual oxides having the length of 2 µm or more exist in an observation field, the total length of them is 70% or less of a length of the observation field. Adjacent residual oxides are regarded to be continuous when a distance between the adjacent residual oxides is 1 µm or less, even if a length thereof is less than 2 µm.

If the residual-continuous oxides exist at this end part of a bonded part with more than 70% of the length of the observation view, there is a risk that the separation would be occurred at an end part of the metal plate when bonding the metal plate and the heat sink in the bonded interface of the ceramic substrate and the metal plate.

A manufacturing method of power-module substrate according to the present invention is a method of manufacturing the power-module substrate by bonding a metal plate made of aluminum or aluminum alloy to at least one surface of a ceramic substrate by brazing, using the metal plate having an oxygen concentration of 1.5 mass % or less analyzed from a count number of oxygen measured by an electron probe micro analyzer by an accelerating voltage 10 kV, an electric current 100 mA, and a beam diameter 100 µm, and an oxide thickness of 35 Å or less measured by an X-ray photoelectron spectroscopy analysis in a thickness direction as the metal plate before bonding to the ceramic substrate.

By using the metal plate having the oxygen concentration and the oxide thickness in the above measured values as the previous state of bonding to the ceramic substrate, it is possible to reduce residual-continuous oxides after bonding and prevent the small voids from being generated.

In the manufacturing method of power-module substrate according to the present invention, 1.3 µm or more of a surface layer of the metal plate may be removed before bonding the metal plate to the ceramic substrate.

As the oxide of the metal plate, an oxide film generated on a surface of the metal plate is generally supposed. However, if removing merely the oxide film, the residual oxide at the bonded part is not disappeared. By researching and studying adhered oxide other than the oxide film, the inventors found that wear debris and the like when the metal plate was rolled was buried in the surface of the metal plate, and oxide of the wear debris and the like were remained in the bonded part. Since the wear debris and the like are rough and large with comparing to the oxide film on the surface of the metal plate, it is necessary to remove the surface layer 1.3 µm or more in order to remove the wear debris and the like. Etching is suitable to remove it; and blasting, or combination of blasting and etching may be applied.

In the manufacturing method according to the present invention, it is preferable that arithmetic-mean-roughness Ra of a surface of the metal plate be 0.05 µm or more and 0.30 µm or less before bonding to the ceramic substrate.

The oxide is divided by fine roughness generated on the surface of the metal plate, and the brazing material melted while brazing is divided and flows isotropically in the bonded surface. As a result, the oxide is restrained from being converged to a specific end part, and it is possible to reduce the residual-continuous oxides existing continuously by 2 µm or more.

In the manufacturing method according to the present invention, it is preferable that in the arithmetic-mean-roughness Ra, a difference between arithmetic-mean-roughness along a rolling direction of the metal plate and arithmetic-mean-roughness along a perpendicular direction to the rolling direction be 0.1 µm or less.

Since surface condition of the metal plate is more isotropic, anisotropy of the separation is reduced, and reduction effect of separation rate can be further improved.

Effects of the Invention

According to the power-module substrate and the manufacturing method thereof of the present invention, reducing the small voids in the bonded part between the ceramic substrate and the metal plate, the separation of the metal plate at the end part can be prevented, so that bonding reliability can be improved.

DETAILED DESCRIPTION OF THE INVENTION

Figure 1:
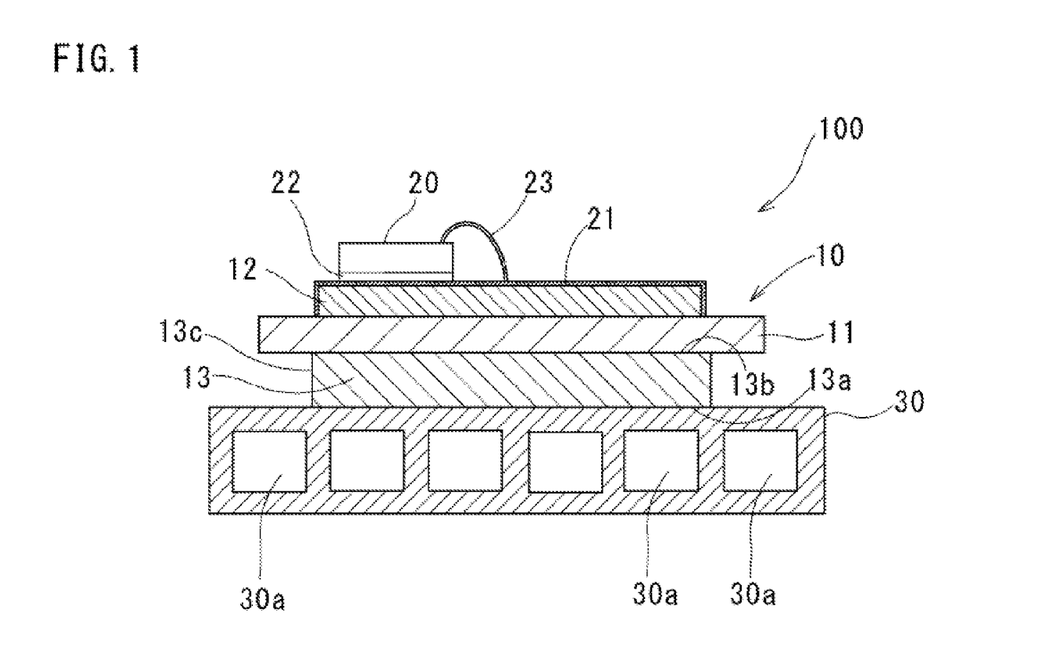
FIG. 1 It is a vertical cross-sectional view showing an entire configuration of a power module according to the present invention.

Below, an embodiment of the present invention will be explained with referring the drawings. FIG. 1 shows a power module 100 using a power-module substrate 10 according to the present invention. The power module 100 is configured from: the power-module substrate 10; an electronic component 20 such as a semiconductor chip or the like mounted on a surface of the power-module substrate 10; and a heat sink 30 bonded to the power-module substrate 10 on an opposite surface to the electronic component 20.

The power-module substrate 10 is provided with a ceramic substrate 11, and metal plates 12 and 13 laminated on both surfaces of the ceramic substrate 11. In the power-module substrate 10, the metal plate 12 laminated on one surface of the ceramic substrate 11 is to be a circuit layer in which the electronic component 20 is soldered on a surface thereof. The other metal plate 13 is to be a heat-radiation layer in which the heat sink 30 is mounted on a surface thereof.

The ceramic substrate 11 is made of AlN (aluminum nitride), and has a thickness of 635 µm, for example.

The metal plates 12 and 13 are aluminum of purity 99 mass % or more: 1000s aluminum, especially, 1N90 (purity 99.9 mass % or more: i.e., 3N aluminum) or 1N99 (purity 99.99 mass % or more: i.e., 4N aluminum) by JIS standard can be applied. Also, aluminum alloys such as JIS A3003 and A6063 and the like can be applied. The metal plates 12 and 13 are formed as a rectangle-flat plate shape 30 mm each side, for example.

In the power-module substrate 10, the metal plate 13 being the heat-radiation layer is formed thicker than the metal plate 12 being the circuit layer in order to impart a function of absorbing a difference by thermal expansion between the ceramic substrate 11 and the heat sink 30 under a heat cycle. For example, a thickness of the metal plate 12 is 600 µm; and a thickness of the metal plate 13 is 1600 µm. For the metal plate 13 being the heat-radiation layer, it is desirable to use aluminum with high purity (e.g., 1N99).

The metal plates 12 and 13 are bonded to the ceramic substrate 11 by brazing. As brazing material, alloys such as Al—Si-based, Al—Ge-based, Al—Cu-based, Al—Mg-based or Al—Mn-based or the like can be used.

In this case, in each of bonded parts between the ceramic substrate 11 and the metal plates 12 and 13, when a cross section of the metal plate 12 or 13 (i.e., a cross section across a below-mentioned width direction) is observed by a scanning electron microscope (SEM) in a field of 3000 magnifications in a depth extent of 5 µm from a bonded interface between the metal plate 12 or 13 and the ceramic substrate 11 in a width area of 200 µm from a side edge of the metal plate 12 or 13, residual-continuous oxide existing continuously by 2 µm or more along the bonded interface has a total length of 70% or less with respect to a length of the field.

Figure 2:
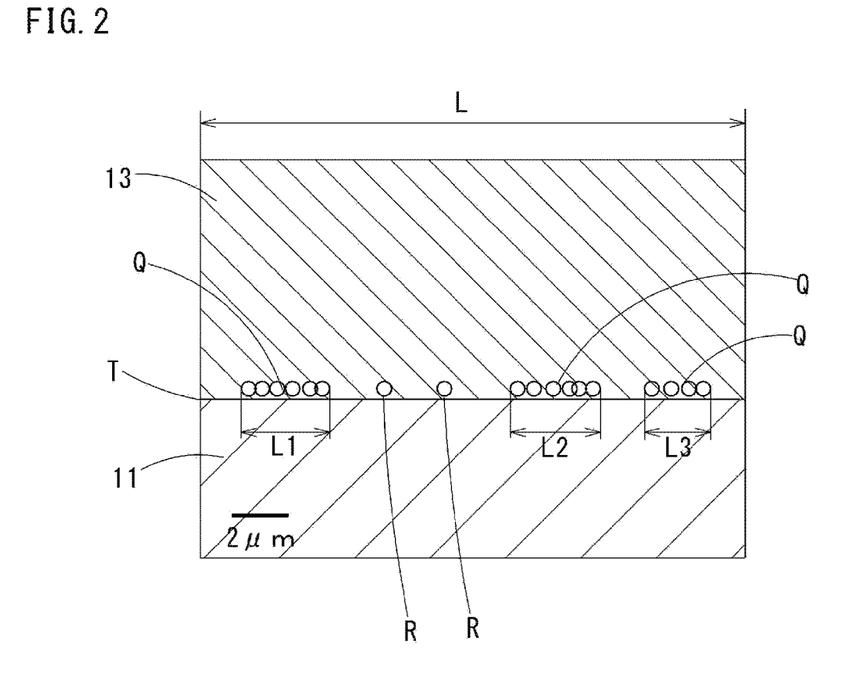
FIG. 2 It is an enlarged vertical cross-sectional view schematically showing a principal part of a bonded part between a ceramic substrate and a metal plate.

The residual-continuous oxide is that has a length of 2 µm or more out of residual oxide existing along the bonded interface. If a plurality of the residual oxides having the length of 2 µm or more exist in an observation field, the total length of them is 70% or less of a length of the observation field. Adjacent residual oxides are regarded to be continuous when a distance between the adjacent residual oxides is 1 μm or less, even if a length of the residual oxide is less than 2 μm.

It will be explained by the cross section between the ceramic substrate 11 and the metal plate 13 shown in FIG. 2. In a case in which residual oxide exists along a bonded interface T between the ceramic substrate 11 and the metal plate 13: residual-continuous oxide Q is continuous for 2 μm or more; and single residual oxide R is adjacent with a mutual interval of 1 μm or more. A sum of lengths of the residual-continuous oxides Q is a length of the residual-continuous oxide (L1+L2+L3). If a length of the observation field by SEM is L, the residual-continuous oxide exists by a rate (a percentage) of (L1+L2+L3)/L with respect to the length of the observation field.

The heat sink 30 is not limited to a specific shape, is formed from a material having an excellent thermal conductivity, e.g., aluminum alloy of A3000s, and has a plurality of passages 30a formed therein to let coolant (e.g., cooling water) flows therethrough. The heat sink 30 and the metal plate 13 to be the heat-radiation layer of the power-module substrate 10 are bonded to each other by brazing. As the brazing material, alloys such as Al—Si-based, Al—Ge-based, Al—Cu-based, Al—Mg-based or Al—Mn-based or the like can be used.

On a surface of the metal plate 12 to be the circuit layer, a plating layer 21 of Ni—P or the like is formed; and the electronic component 20 is bonded on the plating layer. For bonding the electronic component 20, soldering material such as Sn—Ag—Cu-based, Sn—Cu-based, Sn—Ag-based, Sn—Sb-based, Zn—Al-based or Pb—Sn-based or the like is used. The reference symbol 22 indicates the solder-bonding layer in FIG. 1. The electronic component 20 and terminal parts of the metal plate 12 are connected by bonding wires 23 made from aluminum.

The power-module substrate 10 is formed by bonding the metal plates 12 and 13 to the ceramic substrate 11; and after that, the heat sink 30 is bonded to the metal plate 13. Specifically, first, the metal plates 12 and 13 are formed by pressing sheet material. In this case, the metal plate 12 to be the circuit layer is formed by merely being stamped out from the sheet material. The metal plate 13 to be the heat-radiation layer is stamped out from the sheet material and processed.

Next, the surfaces of both the metal plates 12 and 13 are etched.

The etching process is carried out so that the metal plates 12 and 13 are soaked in an NaOH solution with a concentration of 5% as etchant with solution temperature of 50° C. for a prescribed time. Process time is set so that 1.3 μm or more of surface layers of the metal plates 12 and 13 can be removed. An etching depth is obtained from a relation between specific gravities and areas of the metal plates 12 and 13 by calculating an etching amount from differences between a weight before processing and a weight after processing of the metal plates 12 and 13.

By this etching process, the surfaces of the metal plates 12 and 13 have: oxygen concentrations of 1.5 mass % or less analyzed from a count number of oxygen measured by an electron probe micro analyzer (EPMA) by an accelerating voltage 10 kV, an electric current 100 mA, and a beam diameter 100 μm; and oxide thicknesses of 35 Å or less measured by an X-ray photoelectron spectroscopy (XPS) analysis in a thickness direction.

Measuring conditions of the X-ray photoelectron spectroscopy is set as: output power of an X-ray source is 100 W; pass energy is 26 eV; measuring step is 0.05 eV; a beam diameter is 100 μm×1.4 mm as an analysis region; a detecting angle is 90°; and a detecting depth is 80 Å. The oxide thickness is obtained by: separating waves of an oxide peak derived from the oxide and a metal peak of base metal from a spectrum obtained by the X-ray photoelectron spectroscopy; and assigning an area rate of the metal peak to a next Formula (1) by these data analysis.

$$d = 2.68 \times \ln(1/A) \times 10 \quad (1)$$

d: oxide thickness (Å)
A: area rate of metal peak

The surfaces of the metal plates 12 and 13 after the etching process are formed to be rough with arithmetic-mean-roughness Ra of 0.05 μm or more and 0.30 μm or less. In this case, the metal plates 12 and 13 are made by rolling, a difference between the arithmetic-mean-roughness along a rolling direction and the arithmetic-mean-roughness along a perpendicular direction to the rolling direction is 0.10 μm or less, so that rolling lines and the like generated by rolling are removed and there is no directionality of surface roughness.

Next, the ceramic substrate 11 is stacked on a substrate-bonding surface 13b of the metal plate 13 with interposing the brazing material; and the other metal plate 12 is stacked on this ceramic substrate 11 with interposing the brazing material. In this case, it is preferable that a brazing-material foil be laminated in advance on sheet material when the metal plates 12 and 13 are stamped out from the sheet material by the pressing process so that the metal plates 12 and 13 on which the brazing-material foil is laminated are formed by stamping the sheet material together with the brazing-material foil. The ceramic substrate 11 and the metal plates 12 and 13 which are stacked on each other are brazed by being heated in vacuum atmosphere with being pressed in the thickness direction.

Figure 3:
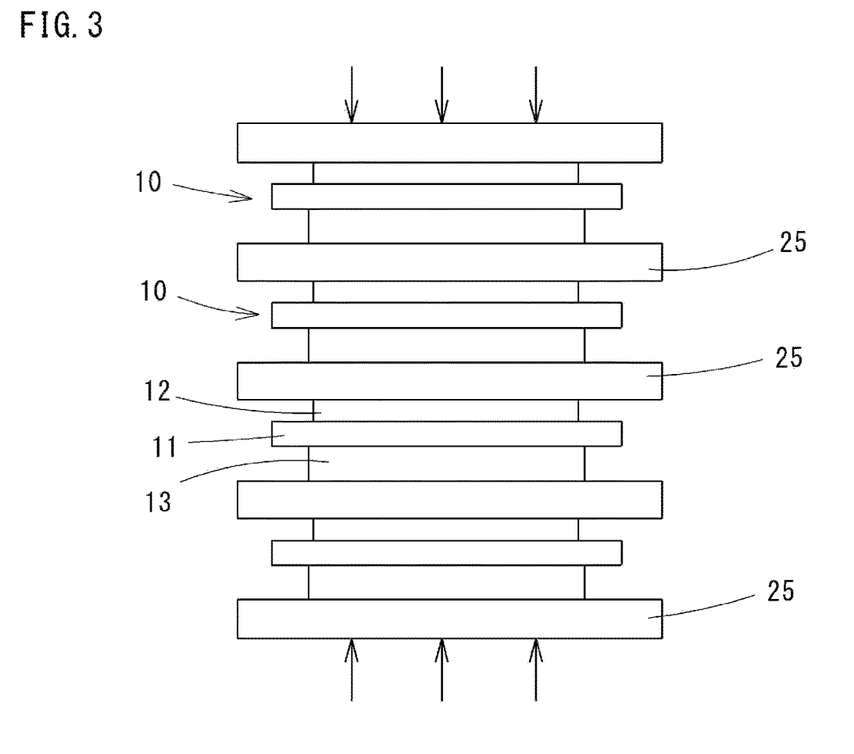
FIG. 3 It is a front view showing a stacking state in brazing of a power-module substrate.

More specifically, as shown in FIG. 3, a plurality of units of the ceramic substrates 11 and the metal plates 12 and 13 are stacked; cushion layers 25 made of carbon plates, graphite plates and the like are interposed between the units respectively; and these are pressed and heated in the stacked state. At this time, applied pressure is 0.1 to 2.5 MPa, heating temperature is 630 to 655° C., and heating time is 1 to 60 minutes. In this brazing process, the brazing material between the ceramic substrate 11 and the metal plates 12 and 13 is melted and fix them. Accordingly, the substrate-bonding surface 13b of the metal plate 13 and the ceramic substrate 11 are brazed, so that the power-module substrate 10 is manufactured.

In this case, though the brazing material between the ceramic substrate 11 and the metal plates 12 and 13 is melted into flow condition, the melted brazing material is not converged in one place but flows isotropically with being dispersed since the surface roughness of the metal plates 12 and 13 is 0.05 μm or more and 0.30 μm or less in Ra and the difference between the arithmetic-mean-roughness along the rolling direction and the arithmetic-mean-roughness perpendicular to the rolling direction is 0.10 μm or less.

If the rolling lines are remained on the metal plate, the brazing material flows along the rolling lines; if oxide is remained on the surface of the metal plate with such a surface state, the oxide flows together with the brazing material and is converged at end parts of the rolling lines. On the other hand, if the metal plates 12 and 13 of the present embodiment are used, the oxides on the surfaces of the metal plates 12 and 13 are reduced; and even if the oxide is slightly remained, the brazing material is dispersed and flows isotropically, so that the oxide is not converged at a specific end part. Moreover, even in a case in which small voids are attached to the oxide, the small voids are not converged at a specific part of the bonded part and are dispersed.

By being manufactured as above-mentioned, when the cross section of the metal plates 12 and 13 are observed by the scanning electron microscope (SEM) in the field of 3000 magnifications in the depth extent of 5 μm from the bonded interface between the metal plates 12 and 13 and the ceramic substrate 11 in a width area of 200 μm from the side edges of the metal plates 12 and 13, the residual-continuous oxides existing continuously by 2 μm or more along the bonded interface has total length of 70% or less with respect to the length of the field. Then, the plating layer 21 of Ni—P or the like is formed on the surface of the metal plate 12 to be the circuit layer, so that the power-module substrate 10 is obtained.

Next, the metal plate 13 to be the heat-radiation layer of the power-module substrate 10 and the heat sink 30 are bonded by a brazing method using flux (a Nocolok brazing method) so that the power-module substrate 10 and the heat sink 30 are bonded. This is a brazing method of brazing by applying fluoride-based flux on a surface of the brazing-material for removing oxide on a metal surface and heating at 600 to 615° C. in a non-oxidation atmosphere (e.g., $N_2$ atmosphere).

For this flux, $KAlF_4$, $K_2AlF_5$, $K_3AlF_6$ and the like are used. The brazing material for bonding the metal plate 13 and the heat sink 30 is, for example, Al—Si-based alloy which is supplied by cladding on a surface of the heat sink 30 in advance or stacking on the heat sink 30 in a state of a brazing-material foil.

In the brazing process, since the power-module substrate 10 is heated to 600° C. or higher, if a large void is generated in the bonded part between the ceramic substrate 11 and the metal plates 12 and 13, the flux enters from the void and causes the separation. In the power-module substrate 10 of the present embodiment, since the voids are small and dispersed even if generated as described above, the separation is not occurred.

In a case in which flux is used for bonding the heat sink 30, if the flux flows up along a side surface 13c of the metal plate 13 and corrodes the bonded part between the metal plate 13 and the ceramic substrate 11, there is a risk that the bonded part is cracked and separated.

This flux is for cleaning the metal surface in brazing by washing away the oxide. In order to prevent the flux from entering, it is enough if oxide that is easy to react with the flux does not exist. In this power-module substrate 10, there are only the few residual-continuous oxides in a prescribed-width area from a side edge of the bonded part between the ceramic substrate 11 and the metal plate 13 to be the heat-radiation layer as described above; accordingly, the flux does not enter from this end part, so that the separation can be prevented from occurring.

As explained above, in the power-module substrate 10, even when the metal plate 13 and the heat sink 30 are bonded by brazing using flux, the separation of the end part of the metal plate at the bonded part of the ceramic substrate 11 and the metal plate 13 is prevented, so that bonding reliability of the power-module substrate 10 can be high.

EXAMPLES

In order to confirm effect of the present invention, following experiments were carried out.

Rolled material of 1N99 aluminum having a thickness of 0.6 mm was stamped out into 30 mm×30 mm; an etching process or a blast process shown in Table 1 was carried out; and a removed depth of a surface of a metal plate by the process was measured. The removed depth was obtained from a relation between specific gravity and area of the metal plate by calculating a removed amount from a difference between a weight before processing and a weight after processing of the metal plate.

Regarding the metal plate in which the surface is processed, oxygen concentration was analyzed from a count number of oxygen by an electron probe micro analyzer (EPMA) by an accelerating voltage 10 kV, an electric current 100 mA, and a beam diameter 100 μm; and an oxide thickness was measured by an X-ray photoelectron spectroscopy (XPS) analysis in a thickness direction.

Measuring conditions of X-ray photoelectron spectroscopy is set as: output power of an X-ray source is 100 W; pass energy is 26 eV; measuring step is 0.05 eV; a beam diameter is 100 μm×1.4 mm as an analysis region; a detecting angle is 90°; and a detecting depth is 80 Å. A thickness was obtained from the above-mentioned Formula (1).

Arithmetic-mean-roughness at the surface of the metal plate was measured respectively in each of a rolling direction and a perpendicular direction to the rolling direction.

The metal plates were stacked with both surfaces of a ceramic substrate made from aluminum nitride having a thickness of 0.635 mm with interposing a brazing-material foil made from Al-7.5 mass % Si of 30 mm×30 mm and a thickness 15 μm, and bonded at temperature of 630° C. to 650° C. in vacuo with applying load in a stacking direction.

By observation of a cross section of an obtained power-module substrate, a total length of residual-continuous oxides existing continuously by 2 μm or more along a bonded interface between the metal plates and the ceramic substrate was measured in a field of 3000 magnifications of a scanning electron microscope (SEM) in a part of 100 μm to 200 μm from a side edge of the metal plates in a depth extent of 5 μm from the bonded interface.

In this case, SEM of Ultra 55 made by Carl Zeiss AG was used with below conditions.

Observation face: mirror surface by chemical polishing (no deposition)
Signal A: In-lens
Mag: 3.00 KX
WD: 4.0 mm
EHT: 1 kV (accelerating voltage)

Adjacent residual oxides were regarded to be continuous when a distance between the adjacent residual oxides is 1 μm or less, even if a length of the residual oxide was less than 2 μn.

Next, on a heat sink made from A1050 aluminum material having a thickness of 5 mm, Nocolok flux "FL-7" made by Morita Chemical Industries Co., Ltd. was applied and the metal plate of the power-module substrate was stacked with interposing a brazing-material foil made from Al-10 mass % Si having a thickness of 70 μm; and then these were bonded by heating at 610° C. in nitrogen atmosphere. A separation rate of a bonding interface between the ceramic substrate and the metal plate fixed on the heat sink was measured after bonding and a separation rate after a hot-cold cycle test in liquid tank were measured. The hot-cold cycle test in liquid tank is a test repeating an operation of soaking 3000 cycles for 10 minutes alternately in a bath of −40° C. and a bath of 100° C.

An end-part separation rate was obtained by evaluating the bonded part by ultrasonic test equipment and calculating by a formula of an end-part separation rate=an area of an end-part separated portion/an initial-bonded area. The initial-bonded area is an area which should be bonded before bonding, i.e., a metal-plate area of a heat-radiation layer. The end-part separated portion is a separated portion in which an end edge of the metal plate is separated, i.e., a separated portion having an opening at the end edge of the metal plate. In an ultrasonic test image, since the separation is indicated by white part in the bonded part, the area of the end-part separated portion having the opening at the end edge of the metal plate was measured in the white part.

Figure 4:
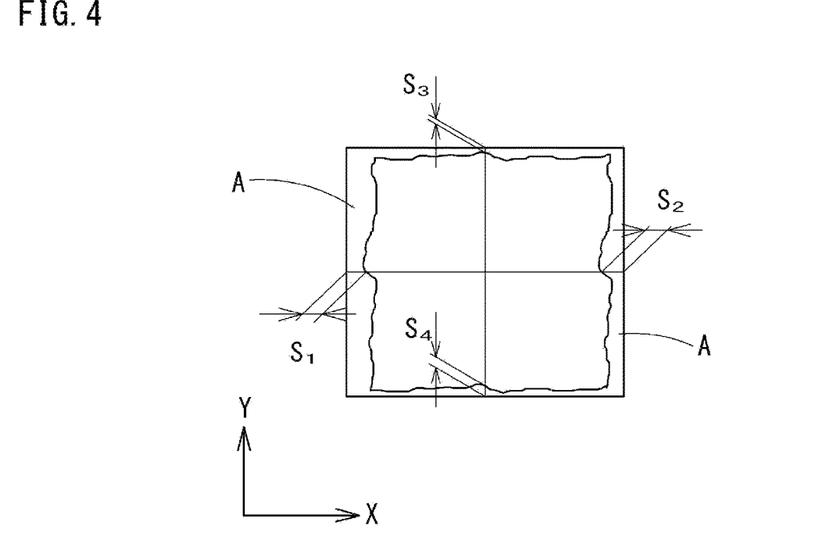
FIG. 4 It is a plan view showing the metal plate for explaining a length of separation.

A separation length was obtained using the ultrasonic test equipment from a separation length at center positions of four sides of the metal plate of the heat-radiation layer after the hot-cold cycle test in liquid tank. Specifically, as shown in FIG. 4, measuring lengths S1, S2 and S3, S4 of separations A at the respective center positions of two sides opposed to each other in a rolling direction (an X direction) and a perpendicular direction (a Y direction) of the metal plate, respective mean values (S1+S2)/2 and (S3+S4)/2 in the X direction and the Y direction were calculated. The respective lengths S1 to S4 of the separations A were set as lengths of perpendicular lines to the nearest sides from tops of the separations A.

Results were shown in Table 1.

and the separation rate was small. The power-module substrate in which the rate of the length of the residual-continuous oxide is 70% or less is small in the subsequent separation rate after the hot-cold cycle test, so that a bonding state can be maintained with high long-term reliability.

Figure 5:
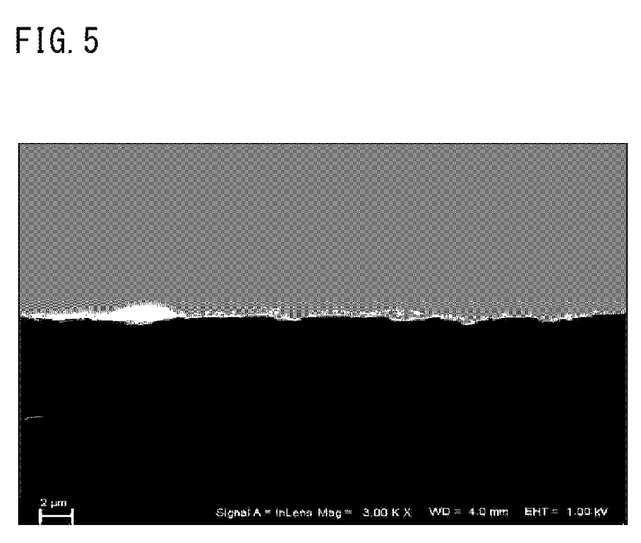
FIG. 5 It is a picture of an SEM section showing a bonded part of a comparative example 6.

FIG. 5 is a cross-sectional photograph of Comparative Example 3 by SEM, showing the ceramic substrate in a lower part and the metal plate in an upper part. In FIG. 5, the residual oxide is found at the metal plate side of the bonding interface between the ceramic substrate and the metal plate, as a row of a white part along the bonding interface; and it is found that the residual oxide exists with relatively large length.

From the result of Table 1, it is found that: it is effective to use the metal plate having oxygen concentration of 1.5 mass % or less analyzed by EPMA and an oxide thickness

TABLE 1

| | MANUFACTURING METHOD | | EVALUATION OF METAL PLATE | | | |
|---|---|---|---|---|---|---|
| | SURFACE TREATMENT | REMOVED DEPTH (μm) | OXYGEN CONCENTRATION (mass %) | OXIDE-FILM THICKNESS (Å) | ARITHMETIC MEAN ROUGHNESS Ra (μm) | Ra DIFFERENCE (μm) |
| EXAMPLE 1 | ETCHING | 3.0 | 1.2 | 28 | 0.21 | 0.07 |
| EXAMPLE 2 | ETCHING | 2.0 | 1.4 | 30 | 0.23 | 0.05 |
| EXAMPLE 3 | ETCHING | 1.5 | 1.4 | 39 | 0.20 | 0.06 |
| EXAMPLE 4 | ETCHING | 1.3 | 1.4 | 29 | 0.21 | 0.08 |
| EXAMPLE 5 | (1) BLAST | | 1.3 | 32 | 0.15 | 0.03 |
| EXAMPLE 6 | (2) BLAST | | 1.5 | 33 | 0.17 | 0.03 |
| EXAMPLE 7 | ETCHING | 1.0 | 1.2 | 28 | 0.20 | 0.05 |
| COMPARATIVE 1 | ETCHING | 0.5 | 4.5 | 40 | 0.32 | 0.12 |
| COMPARATIVE 2 | ETCHING | 0.2 | 6.3 | 39 | 0.37 | 0.13 |
| COMPARATIVE 3 | NON-TREATED | — | 7 | 42 | 0.42 | 0.12 |

| | EVALUATION OF DBA SUBSTRATE | | | | |
|---|---|---|---|---|---|
| | TOTAL LENGTH OF RESIDUAL LINKING OXIDE/ FULL LENGTH OF OBSERVATION FIELD (%) | END-PART SEPARATION RATE (%) | | SEPARATION LENGTH AFTER HOT/COLD CYCLE (min) | |
| | | INITIAL | AFTER HOT/COLD | X DIRECTION | Y DIRECTION |
| EXAMPLE 1 | 20 | 0.1 | 6.6 | 0.6 | 0.4 |
| EXAMPLE 2 | 30 | 0.2 | 7.2 | 0.6 | 0.5 |
| EXAMPLE 3 | 50 | 0.2 | 7.8 | 0.7 | 0.6 |
| EXAMPLE 4 | 70 | 0.2 | 6.6 | 0.6 | 0.4 |
| EXAMPLE 5 | 40 | 0.1 | 8.5 | 0.7 | 0.6 |
| EXAMPLE 6 | 50 | 0.1 | 8.5 | 0.7 | 0.6 |
| EXAMPLE 7 | 70 | 0.4 | 9.0 | 0.8 | 0.7 |
| COMPARATIVE 1 | 75 | 1.2 | 29.1 | 3.6 | 1.0 |
| COMPARATIVE 2 | 80 | 2.3 | 27.7 | 3.3 | 1.1 |
| COMPARATIVE 3 | 85 | 2.8 | 31.3 | 3.8 | 1.2 |

In surface treatment of Table 1, conditions of (1) blast to (2) blast were below.
(1) Blast: Blasting by resin-coated abrasive grain of grain size #8000
(2) Blast: Blasting by resin-coated abrasive grain of grain size #3000

As shown by the results of Table 1, it is found that the separation rate in an initial state after bonding the heat sink is extremely small if a rate of the length of the residual-continuous oxide is 70% or less. If there are small voids, they are reflected by white parts in the ultrasonic test image. It can be supposed that the rate of the length of the residual oxide was small, so that there were not the many small voids of 35 Å or less measured by XPS analysis so that the bonding part to have the rate of the length of the residual oxide 70% or less; in this case, it is found that the metal plate reliably has the oxygen concentration 1.5 mass % or less and the oxide thickness 35 Å or less by removing the surface of the metal plate up to a depth of 1.3 μm or more.

It is found that: a reduction effect of the separation rate after hot-cold cycle is remarkable if the surface roughness Ra of the metal plate is 0.05 μm to 0.30 μm; and an anisotropy of the separation is reduced if a difference of the surface roughness between the rolling direction and the perpendicular direction is 0.10 μm or less, so that the reduction effect of the separation rate is further improved.

INDUSTRIAL APPLICABILITY

The present invention can be applied on a case for manufacturing a power-module substrate which configures a power module controlling a large electric current and a large voltage; and it is possible to obtain a power-module substrate in which a separation at an end part of a metal plate can be prevented so that bonding reliability can be improved.

DESCRIPTION OF REFERENCE SYMBOLS 10 power-module substrate
11 ceramic substrate
12 metal plate
13 metal plate
13a heat sink bonding surface
13b substrate-bonding surface
13c side surface
20 electronic component
21 plating layer
22 solder-bonding layer
23 bonding wire
25 cushion layer
30 heat sink
30a passage
100 power module
T bonded interface
Q residual-continuous oxide

What is claimed is:

1. A power-module substrate made by bonding a metal plate made of aluminum or aluminum alloy to at least one surface of a ceramic substrate in a shape of a plate by brazing, wherein residual oxide existing continuously by 2 µm or more along a bonded interface between the metal plate and the ceramic substrate has total length of 70% or less and 20% or more with respect to a length of a field of 3000 magnifications by observing a cross section of the metal plate in a depth extent of 5 µm from the bonded interface in a width area of 200 µm from a side edge of the metal plate by a scanning electron microscope.

* * * * *